United States Patent [19]

Miniet

[11] Patent Number: 4,533,188
[45] Date of Patent: Aug. 6, 1985

[54] HEADER AND HOUSING ASSEMBLY FOR ELECTRONIC CIRCUIT MODULES

[75] Inventor: Jay J. Miniet, Fort Lauderdale, Fla.

[73] Assignee: Motorola, Inc., Schaumburg, Ill.

[21] Appl. No.: 466,465

[22] Filed: Feb. 15, 1983

[51] Int. Cl.³ .......................... H01R 4/02; H05K 1/00
[52] U.S. Cl. .............................. 339/17 CF; 339/275 B
[58] Field of Search ............. 339/17 CF, 275, 136 R, 339/136 M, 142

[56] References Cited

U.S. PATENT DOCUMENTS

| | | | |
|---|---|---|---|
| 1,982,627 | 12/1934 | Baum | 339/142 |
| 2,289,512 | 7/1942 | McKenney et al. | 339/275 T |
| 3,216,089 | 11/1965 | Dettman | 339/17 CF |
| 3,300,686 | 1/1967 | Johnson et al. | 317/101 |
| 3,331,912 | 7/1967 | Stricker et al. | 339/275 B |
| 3,492,538 | 1/1970 | Fergusson | 317/101 |
| 3,644,868 | 2/1972 | Nevala | 339/17 LM |
| 3,652,899 | 3/1972 | Henschen | 317/101 DH |
| 3,696,323 | 10/1972 | Kinkaid et al. | 339/275 T |
| 3,900,239 | 8/1975 | Anhalt et al. | 339/17 CF |
| 4,010,992 | 3/1977 | Crimmins et al. | 339/275 B |
| 4,025,148 | 5/1977 | Bouley | 339/17 CF |
| 4,054,939 | 10/1977 | Ammon | 361/414 |
| 4,089,043 | 5/1978 | Fraboni et al. | 361/415 |
| 4,189,199 | 2/1980 | Gray | 339/17 CF |
| 4,250,536 | 2/1981 | Barringer et al. | 361/413 |
| 4,255,004 | 3/1981 | Kourimsky et al. | 339/17 E |
| 4,270,829 | 6/1981 | Wilson | 339/275 B |
| 4,357,065 | 11/1982 | Kam et al. | 339/17 F |
| 4,389,080 | 6/1983 | Clark et al. | 339/136 M |
| 4,417,777 | 11/1983 | Bamford | 339/17 CF |
| 4,427,247 | 1/1984 | Petersen | 339/14 R |

FOREIGN PATENT DOCUMENTS 1034027  7/1953  France ................. 339/191 R

Primary Examiner—Gil Weidenfeld
Assistant Examiner—Gary F. Paumen
Attorney, Agent, or Firm—Charles L. Warren; Edward M. Roney; James W. Gillman

[57] ABSTRACT

An improved header and housing assembly for holding a miniaturized electronic circuit module having a plurality of leads includes a header member having a plurality of apertures arranged to accept the leads of the module. A jaw mechanism associated with each aperture captivates the leads and a protective housing encloses the module between the header member and the housing. An interconnection board which is mounted to a flexible printed circuit board engages the header and housing assembly and forms a base permitting the assembly to be mounted to the flexible circuit board.

8 Claims, 3 Drawing Figures

HEADER AND HOUSING ASSEMBLY FOR ELECTRONIC CIRCUIT MODULES

BACKGROUND OF THE INVENTION

The present invention relates generally to connector arrangements for accommodating a plurality of electrical connections associated with an electronic module and, in particular, to a header and housing assembly which facilitates the accomplishment of a plurality of electrical connections to an associated electronic device, while at the same time adequately protecting and shielding associated components mounted on a flex circuit module within the housing in such a manner as to maximize the utilization of available space.

There are many instances where, due to the miniaturization and portability of an electronic device, the relative density of the electrical components contained therein places a premium on the available space. Several miniaturized packaging arrangements for electronic discrete components in miniaturized electronic circuit modules which utilize custom headers are known in the art and have various disadvantages when compared with the present invention. Typically, each of the component leads have to be individually inserted into the respective aperture of the header structure. Similarly, component leads of differing geometrics will not properly fit within the header structure, or damage of such leads will result. Header structures found in the art differ for component leads which are keyed and component leads which are not keyed. Finally, the durability of the header structures found in the art do not facilitate reuse of a header structure repeatedly.

So-called flexible printed electronic circuitry of one sort or another has been incorporated in a wide variety of electrical and electronic devices. It is particularly advantageous, however, for use with miniaturized electronic apparatus where space is critical and bulky wire-to-wire connections are to be minimized or eliminated. Facilitating the multiple electrical connections required is generally accomplished through the use of plated through holes.

Portable, two-way communication equipment provides a particular advantageous application for printed circuitry in either flex or printed circuit board form. A single basic or master circuit board can be designed to retain the various required electronic components for the transmitter and receiver elements thereof, and laid out as to effect the various inner-circuit connections to make the apparatus as a whole functional, all within minimum space requirements and optimized efficiency. A disadvantage is that the printed circuit chassis board, once designed and laid out, is thereby fixed operationally and not readily adaptable to meet any additional or alternative operational features. For example, in portable two-way communications equipment, if tone-coded squelch operation is required or if automatic unit identification is to be effected upon interrogation from some centralized location, or if digital voice privacy is desired through coding or decoding options, then it would be expected that an entirely different chassis board would need to be designed so as to implement the desired electronic function in addition to the conventional transmit-and-receive operation of the equipment. It will be readily appreciated and apparent that this creates an added inventory burden, i.e., a different circuit board for each combination of operational capabilities, will increase costs unnecessarily, will be inefficient, inflexible and may very well impair reliability of the portable equipment.

Component lead alignment is critical for proper mating and ease of insertion, into the retention cavities of the header or respective pin openings in an associated printed circuit board. Prior art devices generally accomplish such alignment only with increased complexity of the device used.

A common disadvantage relating to all of the foregoing known prior art devices involves the relatively high cost, complexity and quantity piece parts which comprise the various packaging apparatus for a miniaturized electronic circuit module.

SUMMARY OF THE INVENTION

It is, therefore, an object of this invention to provide an improved header and housing assembly for miniaturized circuit modules which can be wave soldered and which overcomes the foregoing deficiancies found in the prior art.

Another object of the present invention is to provide a header and housing assembly which will accommodate a vertical insertion of keyed component leads in a predetermined fashion, thereby preventing damage to said component leads.

Still another object of the present invention is to provide a header and housing assembly which prevents damage to component leads when inserted into an associated printed circuit board after insertion into the header structure caused by overdeflection of the component leads during insertion.

Yet another object of the present invention is to provide a header and housing assembly which prevents contamination of the plurality of retention cavities contained in the header structure caused by solder migration during a wave soldering process.

Another object of the present invention is to provide a header structure capable of accepting a plurality of component leads of various different cross-sectional geometries, thereby securing the component leads in secure fashion for ready solderability during a wave soldering process.

It is yet another object of the present invention to provide a header and housing assembly which may be used with portable two-way communication equipment, said assembly providing the necessary electrical ground connections and internal RF shielding requirements.

Another object of the present invention is to provide a header and housing assembly which is of low cost and can be readily and easily manuactured.

In practicing the invention, a header and housing assembly for miniaturized electronic circuit modules for a portable electronic device is provided including a header member having a plurality of apertures and a pair of expandable jaws located adjacent each aperture capable of accepting and retaining a lead from an electronic circuit. On the bottom surface of the header are locating pins which position the assembly on a printed circuit board of the portable electronic device. A protective housing interconnects with the header member during the final assembly. The protective housing has an interior cavity into which a flexible circuit is placed within certain guiderails located interiorly to the housing. The guiderails adequately position and locate the captivated flexible circuit modules within the housing. The protective housing has a plurality of grounding tabs and a plurality of extractor slots located on the top exterior surface, to facilitate removal of the captivated flexible circuit in instances of repair.

BRIEF DESCRIPTION OF THE DRAWINGS

The features of the present invention which are believed to be novel are set forth with particularity in the claims. However, the invention itself, together with further objects and advantages thereof, may be best understood by reference to the following description when taken in conjunction with the accompanying drawings, in which like reference numerals refer to like elements in the several figures, and in which:

DETAILED DESCRIPTION OF THE PREFERRED EMBODIMENT

Figure 1:
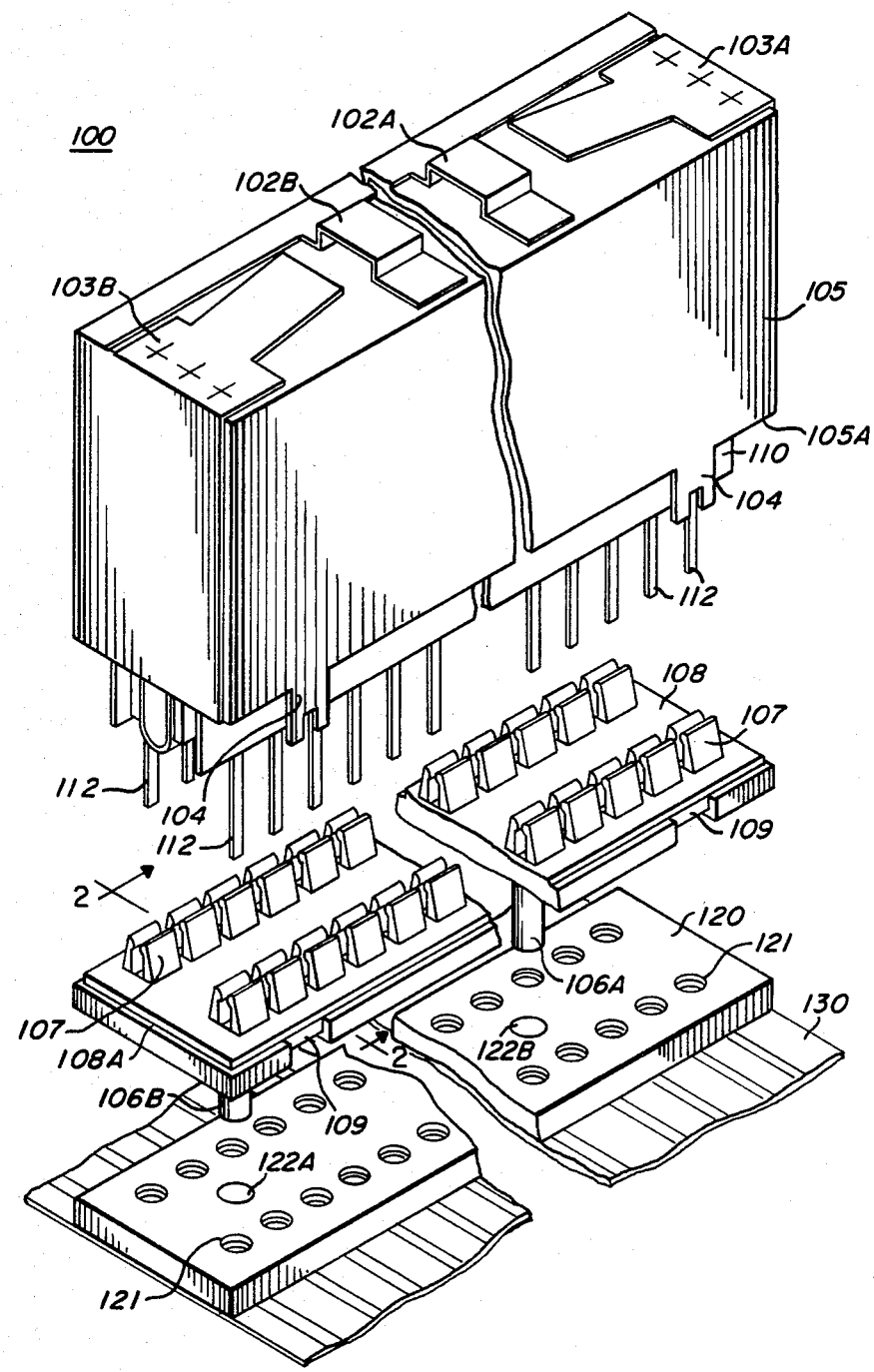
FIG. 1 is an enlarged exploded view in perspective of a header and housing assembly according to the present invention having a miniaturized circuit module with component leads protruding therefrom and an associated interconnect board which is connected to a flexible printed circuit.

Referring now to the drawings, FIG. 1 illustrates a header and housing assembly 100 containing a miniaturized flexible circuit module 110 having a plurality of component leads 112 protruding therefrom and an associated interconnect circuit board 120 with plated-through holes 121 electrically connected to an associated flexible printed circuit 130. The header and housing assembly 100 consists of a protective metal housing 105 and an interlocking header base member 108 which has a cross sectional shape, in this case rectangular, complementary to the metal housing 105 to facilitate a secure attachment and alignment of the metal housing 105 to the header base member 108. The header base member 108 has a slightly protruding ledge 108a about the periphery, which functions as a platform to contiguously receive the bottom edge 105a of the protected metal housing 105.

The metal housing 105 has four integral ground tabs 104 extending in a downward fashion from the two sides of the metal housing 105 into a reciprical number of ground keying slots 109 located at predetermined positions on the header base member 108. The metallic ground tabs 104 extend through the ground keying slots 109 and are anchored to member 108 by bending the ground tabs 104 contiguous to bottom surface of the header base member 108 prior to the solder operation.

At the top of the protective metal housing 105 are located two spring-like RF grounding tabs 103a and 103b. The RF grounding tabs 103 are fastened to the top of the metal housing 105 in such a manner as to protrude in a slightly vertical fashion. When the header and housing assembly is inserted into the respective cavity of the associated electronic equipment, the RF grounding tabs 103 can make contact with a metallic surface of the associated electronic equipment. The RF grounding tabs 103 will act in a coordinated fashion along with the ground tabs 104, thereby providing a good ground for the overall assembly 100 when such is properly placed within the associated electronic equipment. Additionally, once assembled to the header 108, the metal housing 105 serves as an effective ground shield for the overall header and housing assembly 100, thereby preventing RF radiation from entering into or escaping from the electronic module 110 housed therein.

Located on the top surface of the metal housing 105 are two extractor slots 102a and 102b for disengaging the protective metal housing 105 from the overall assembly 100 once the assembly 100 has been inserted into the associated electronic equipment. The extractor slots 102 are designed to accept a tool (not shown) to facilitate the disengagement of the metal housing 105 from the assembly 100.

The interlocking header base member 108 has a predetermined number of pairs of V-angle expandable jaws 107 for receiving the associated component leads 112 arranged in two rows having equal numbers of said V-angle expandable jaws. The jaws form a tight seal against the leads 112 to prevent solder migration along the leads. An aperture 114 (see FIG. 2) is located between each pair of jaws 107 and permits the leads 112 to pass through header 108. Locating guide pins 106a and 106b protrude downward in a vertical fashion from said header base member 108. These locating guide pins 106 align themselves with countersunk holes 122a, 122b which are located on the interconnecting board 120. The component leads 112 are inserted between the respective V-angle expandable jaws 107 and through aperture 114 to protrude in a vertical fashion downward through the header base member 108 into the corresponding plated-through holes 121 of the interconnecting board 120, thereby making electrical contact between the electronic circuit module 110 and the corresponding flex circuit 130 of the associated electronic device. Solder connections may be made between the component leads 112 and the interconnecting board 120.

Figure 2:
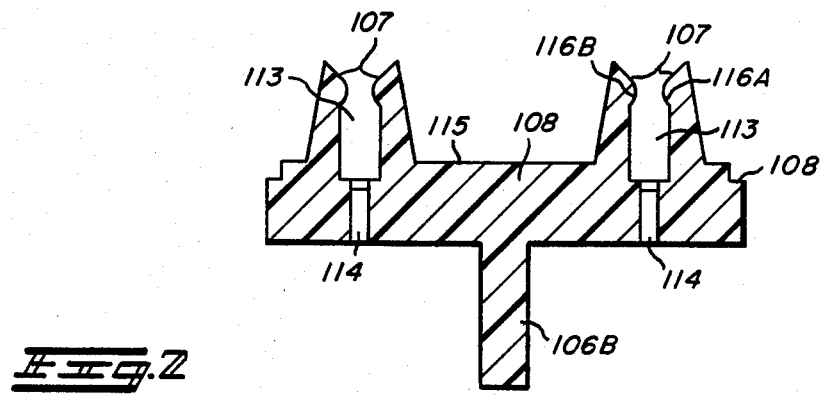
FIG. 2 is a cross sectional view taken along lines 2—2 of FIG. 1.

Referring to FIG. 2, the interlocking header base member 108 is manufactured of a material which is resilient, somewhat pliable and conducive to injection molding or extruding. The base member 108 has a plurality of V-angle expandable jaws 107 capable of accepting a corresponding plurality of component leads 112 of the associated electronic module 110. The V-angle expandable jaws 107 include inwardly facing shoulder members 116a and 116b which define a reduced width passageway, the shoulder members 116 deflect outwardly when the component lead 112 is initially inserted into the jaws 107. Immediately beneath the shoulders is a corresponding retention cavity 113 where the component lead and an edge portion of the board carrying the component lead are held captivated. The diameter or width of the retention cavity 113 is sufficiently large to accommodate the corresponding diameter or thickness of the component lead 112 and associated board. At the bottom of each retention cavity 113 is positioned a respective pin aperture 114 which enable the component leads 112 to protrude through the header base member 108 and remain in a straight position for further insertion into the respective plated-through apertures 121 located on interconnect circuit board 120. Finally, the header base member 108 has two keyed guide pins 106a and 106b protruding in a downward vertical fashion which enable the header base member 108 to be assembled in a predetermined position on the corresponding interconnect circuit board 120. This will ensure that the header and housing assembly 100 will be correctly aligned with the interconnect circuit board 120.

Figure 3:
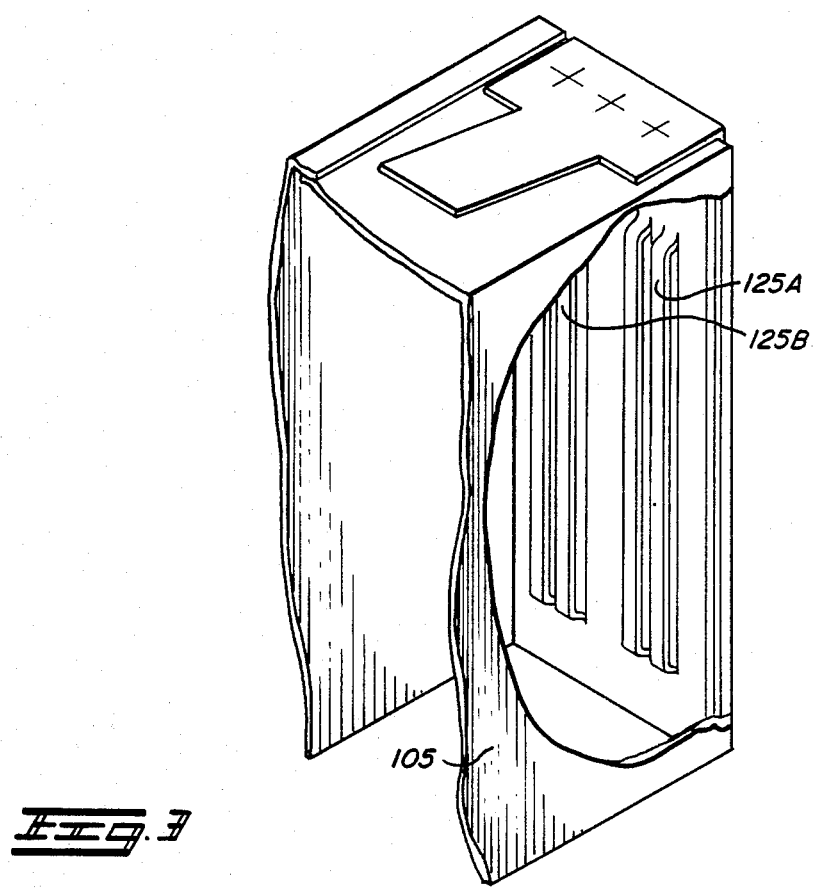
FIG. 3 is an enlarged fragmentary view of a portion of the housing illustrating in detail internal guides for accepting the circuit module.

The enlarged fragmentary view of FIG. 3 represents a portion of the protective metal housing 105 illustrating in detail the internal guiderails which accept the side edges of circuit boards which comprise a part of the miniaturized flexible circuit module 110. At the ends of the protective metal housing 105 and internal thereto are two sets of guiderails 125a and 125b each consisting of first and second rails spaced apart to accept the corresponding thickness of a board of the miniaturized flex circuit module 110 which is to be housed therein. The purpose of the guiderails is to position the miniaturized flexible circuit electronic module 110 therein and inhibit the module 110 from internal movement.

Thus, there has been provided according to the present invention a simple and improved inexpensive header and housing assembly which facilitates the electrical connection and protection of a miniaturized flexible electronic circuit module. Although the foregoing has been a description and illustration of a specific embodiment of the invention, various modifications and changes thereto can be made by persons skilled in the art within the scope and spirit of the invention as defined by the following claims.

What is claimed is:

1. A header and module assembly for holding an electronic circuit module having a sheet of substrate with at least one row of leads which project away from the module, said assembly comprising:
   a header member having a plurality of apertures arranged in a row so that each aperture accepts one of said leads of the electronic circuit module;
   a jaw means adjacent each aperture on said header member for receiving said leads and captivating the module to the header,
   said leads dimensioned to project substantially beyond the apertures when said sheet of substrate is seated within said channel, thereby allowing a direct electrical connection to be made to the portion of the leads which extend beyond the apertures; and
   a flexible printed circuit board and a rigid interconnection board mounted to said flexible circuit board, said interconnection board having a plurality of apertures disposed to align with the corresponding apertures in said header member so that said leads of the electronic circuit module are received by the apertures in said interconnection board.

2. The header and module assembly in accordance with claim 1 further comprising a protective housing dimensioned to receive said module and mounting to said header.

3. The header and module assembly in accordance with claim 1 wherein the header is manufactured from a resilient plastic material.

4. The header and module assembly in accordance with claim 1 wherein the protective housing is made of a conductive metallic material.

5. A header and module assembly in accordance with claim 2 further comprising a securing means including a plurality of slots about the periphery of said header member and a plurality of tabs located on said protective housing to be received by said slots, said tabs when bent contiguous to the bottom of said header member securing same to the protective housing.

6. The header and module assembly in accordance with claim 1 wherein said header member further includes at least one locating pin projecting beyond the bottom-most portion of the header.

7. The header and module assembly in accordance with claim 2 further comprising grounding tabs extending outwardly from the top of said protective housing.

8. The header and module assembly in accordance with claim 2 further comprising an extraction means located on the top of said protective housing for permitting said protective housing to be engaged so that the latter can be removed from said header member.

* * * * *